United States Patent
Ngan et al.

(10) Patent No.: US 6,420,260 B1
(45) Date of Patent: Jul. 16, 2002

(54) TI/TINX UNDERLAYER WHICH ENABLES A HIGHLY <111> ORIENTED ALUMINUM INTERCONNECT

(75) Inventors: Kenny King-tai Ngan, Fremont; Seshadri Ramaswami, San Jose, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/695,941

(22) Filed: Oct. 24, 2000

Related U.S. Application Data

(63) Continuation of application No. 08/824,911, filed on Mar. 27, 1997, now abandoned.

(51) Int. Cl.[7] ...................... H01L 21/4763; H01L 21/44

(52) U.S. Cl. ...................... 438/627; 438/628; 438/648; 438/653; 438/654; 438/685; 438/688

(58) Field of Search ................................ 438/627–628, 438/648, 653–654, 656, 685, 688, 637–640

(56) References Cited

U.S. PATENT DOCUMENTS

| | | | |
|---|---|---|---|
| 4,514,437 A | 4/1985 | Nath | 427/39 |
| 4,911,894 A | 3/1990 | Retallick et al. | 422/174 |
| 4,944,961 A | 7/1990 | Lu et al. | 427/38 |

(List continued on next page.)

FOREIGN PATENT DOCUMENTS

| | | | |
|---|---|---|---|
| EP | 0525637 | 2/1994 | H05K/3/02 |
| EP | 0735586 | 10/1996 | H01L/23/532 |
| WO | WO 9508839 | 3/1995 | H01L/21/285 |

OTHER PUBLICATIONS

S.M. Rossnagel and J. Hopwood, "Metal ion deposition from ionized magnetron sputtering discharge" J. Vac. Sci. Technol. B, vol. 12, No. 1, Jan./Feb. 1994, pp. 449–453.

U.S. patent application Ser. No. 08/753,251 of Ngan et al., filed Nov. 21, 1996.

*Primary Examiner*—Ha Tran Nguyen
(74) *Attorney, Agent, or Firm*—Shirley L. Church; Kathi Bean

(57) ABSTRACT

The present disclosure pertains to particular Ti/TiN/TiN$_x$ barrier/wetting layer structures which enable the warm aluminum filling of high aspect vias while providing an aluminum fill exhibiting a high degree of aluminum <111> crystal orientation. It has been discovered that an improved Ti/TiN/TiN$_x$ barrier layer deposited using IMP techniques can be obtained by increasing the thickness of the first layer of Ti to range from greater than about 100 Å to about 500 Å (the feature geometry controls the upper thickness limit); by decreasing the thickness of the TiN second layer to range from greater than about 100 Å to less than about 800 Å (preferably less than about 600 Å); and, by controlling the application of the TiN$_x$ third layer to provide a Ti content ranging from about 50 atomic percent titanium (stoichiometric) to about 100 atomic percent titanium. Preferably the TiN$_x$ third layer is formed at the end of the deposition of the TiN second layer and exhibits a Ti content gradient which begins at a stoichiometric, 50 atomic percent, Ti content and ends at a Ti content of about 100 atomic percent. The thickness of the TiN$_x$ third layer preferably ranges from about 15 Å to about 500 Å. The improved Ti/TiN/TiN$_x$ barrier layer enables the deposit of a warm aluminum interconnect or a warm aluminum via fill where the aluminum exhibits a high <111> crystallographic content. Further, the aluminum layer obtained exhibits a reflectivity of 150 percent or greater at 436 nm. A Ti/TiN/TiN$_x$ barrier layer having this structure, used to line a contact via, enables complete filling of via with sputtered warm aluminum, where the feature size of the via or aperture, is about 0.25 micron or less and the aspect ratio ranges from about 5:1 to as high as about 6:1.

8 Claims, 7 Drawing Sheets

U.S. PATENT DOCUMENTS

| | | | |
|---|---|---|---|
| 4,990,229 A | 2/1991 | Campbell et al. | 204/298.06 |
| 5,108,951 A | 4/1992 | Chen et al. | 437/187 |
| 5,141,897 A | 8/1992 | Manocha et al. | 437/228 |
| 5,186,718 A | 2/1993 | Tepman et al. | 29/25.01 |
| 5,236,868 A | 8/1993 | Nulman | 437/190 |
| 5,262,361 A | 11/1993 | Cho et al. | 437/245 |
| 5,288,665 A | 2/1994 | Nulman | 437/194 |
| 5,320,728 A | 6/1994 | Tepman | 204/192.12 |
| 5,346,600 A | 9/1994 | Nieh et al. | 204/192.3 |
| 5,360,524 A | 11/1994 | Hendel et al. | 204/192.25 |
| 5,364,664 A | 11/1994 | Tsubouchi et al. | 427/535 |
| 5,371,042 A | 12/1994 | Ong | 437/194 |
| 5,374,592 A | 12/1994 | MacNaughton et al. | 437/194 |
| 5,395,795 A | 3/1995 | Hong et al. | 437/190 |
| 5,464,666 A | 11/1995 | Fine et al. | 427/576 |
| 5,472,912 A | 12/1995 | Miller | 437/194 |
| 5,497,025 A | 3/1996 | Wong | 257/435 |
| 5,525,837 A | 6/1996 | Choudhury | 257/751 |
| 5,526,951 A | 6/1996 | Bailey et al. | 216/24 |
| 5,543,357 A | 8/1996 | Yamada et al. | 437/192 |
| 5,571,752 A | 11/1996 | Chen et al. | 437/189 |
| 5,627,102 A | 5/1997 | Shinriki et al. | 438/648 |
| 5,776,831 A | 7/1998 | Padmanabhan et al. | 438/653 |
| 5,925,225 A | 7/1999 | Ngan et al. | 204/192.17 |
| 5,962,923 A | 10/1999 | Xu et al. | 257/774 |

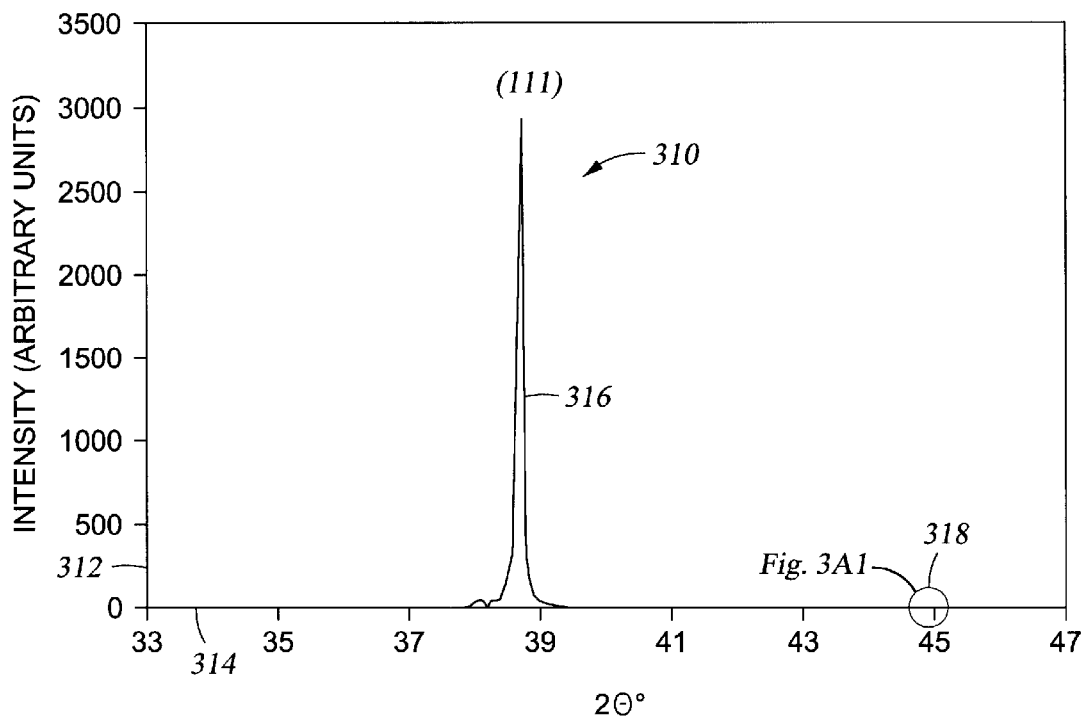
Fig. 3A
(PRIOR ART)
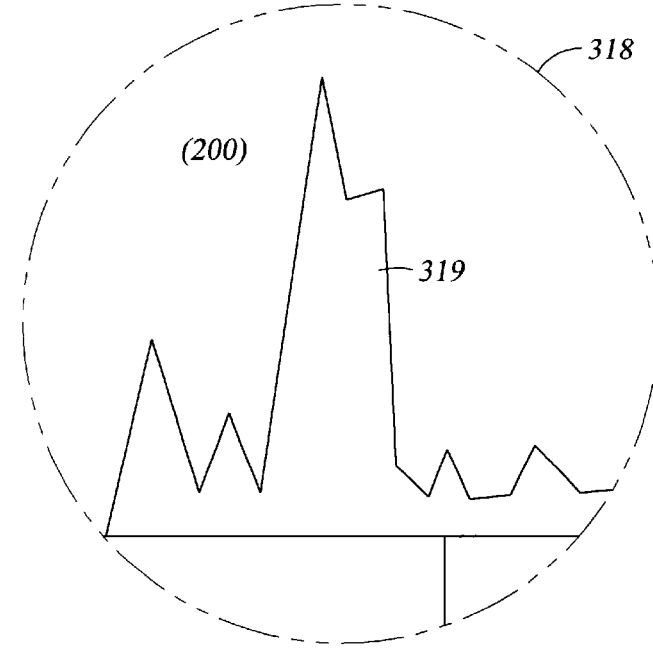
Fig. 3A1
(PRIOR ART)

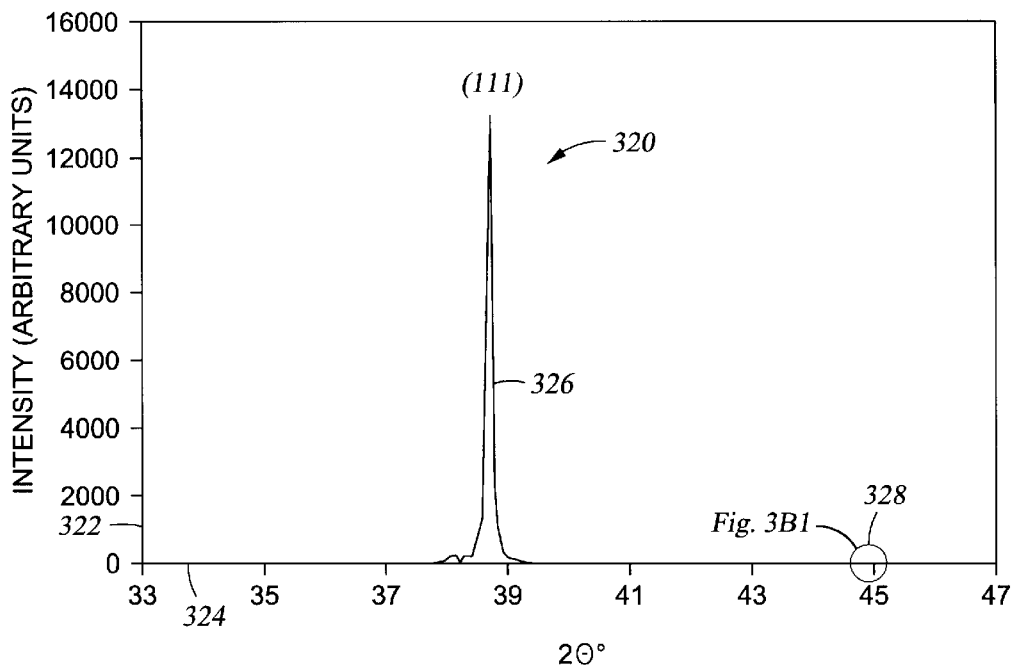
Fig. 3B
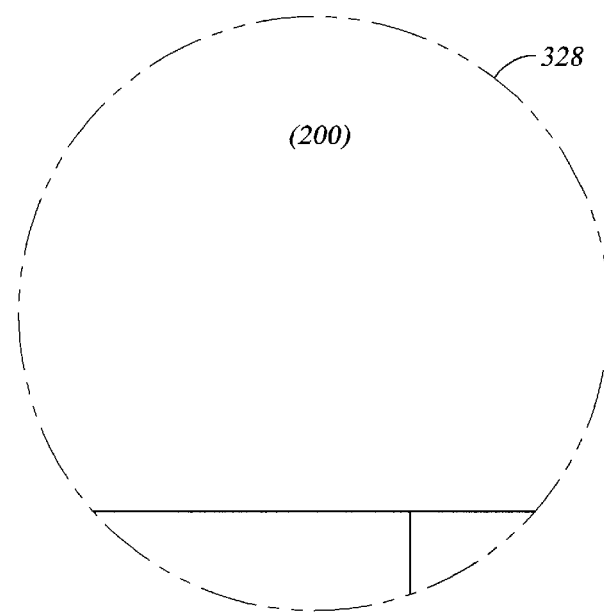
Fig. 3B1

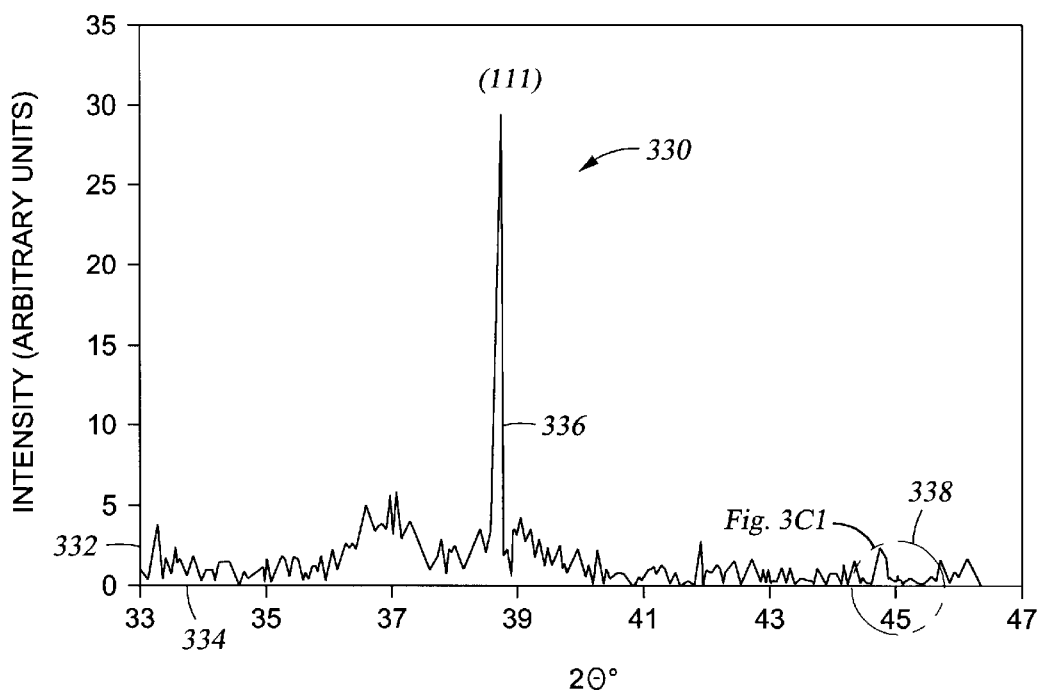
Fig. 3C
(PRIOR ART)
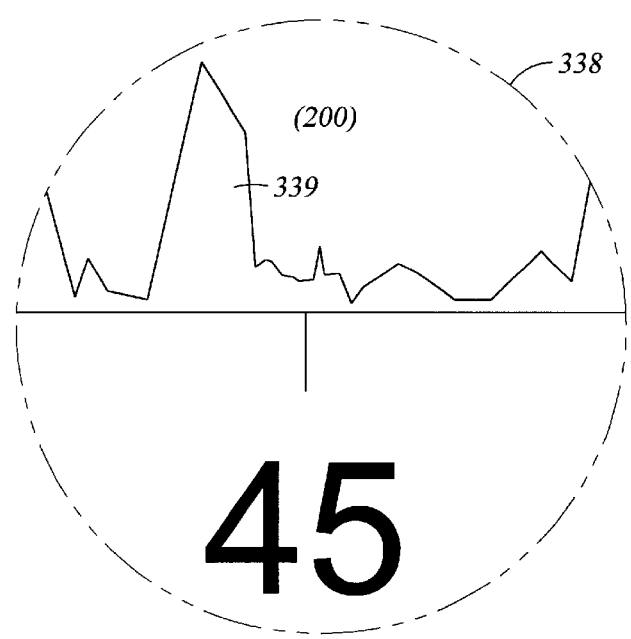
Fig. 3C1
(PRIOR ART)

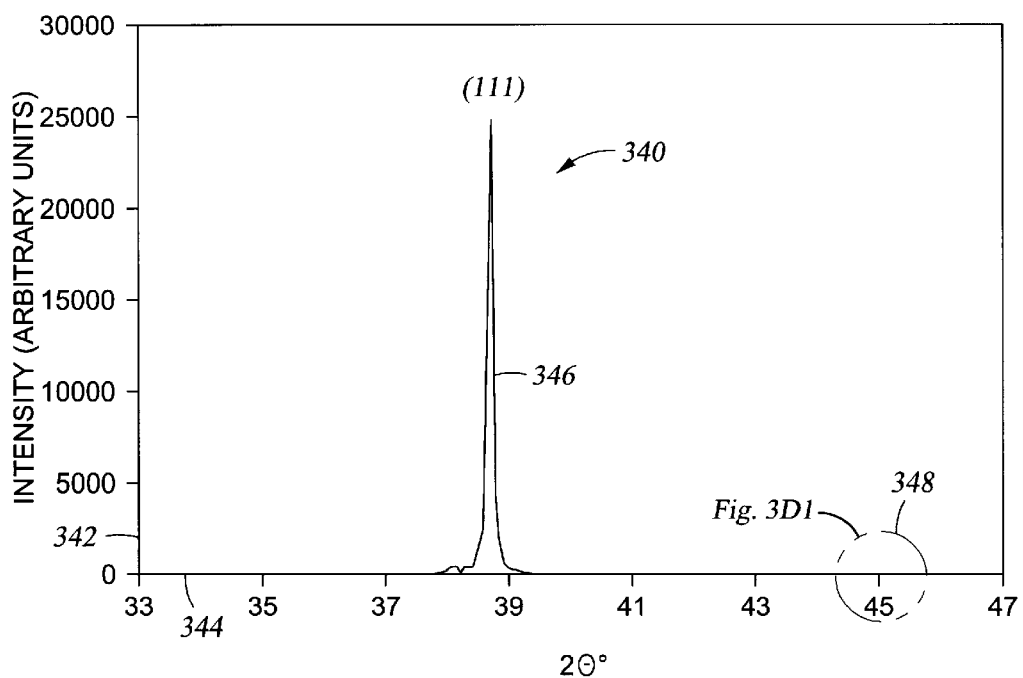
Fig. 3D
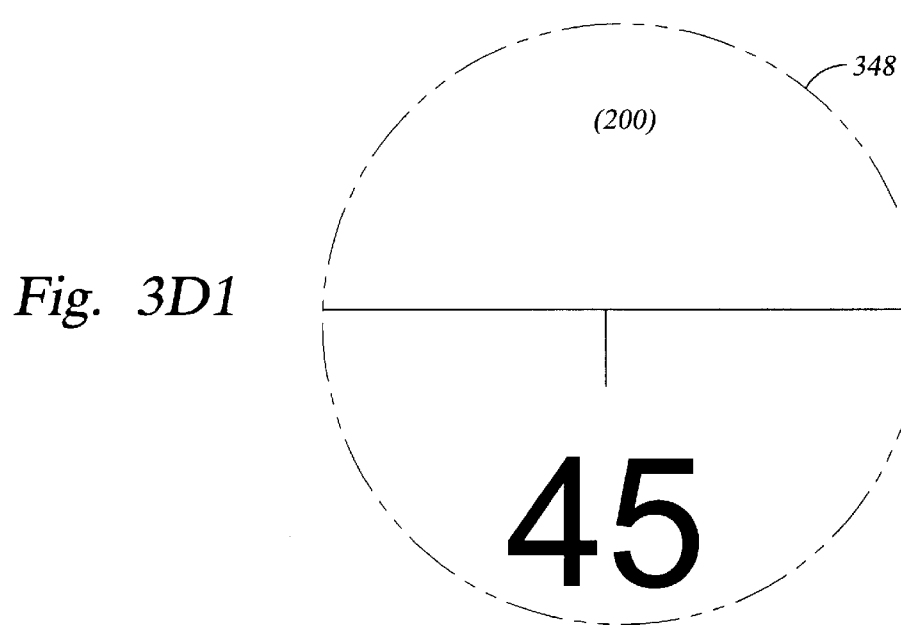
Fig. 3D1

TI/TINX UNDERLAYER WHICH ENABLES A HIGHLY <111> ORIENTED ALUMINUM INTERCONNECT

This application is a continuation application of Application Ser. No. 08/824,911, filed Mar. 27, 1997, which is now abandoned.

BACKGROUND OF THE INVENTION

1. Field of the Invention

The present invention pertains to a particular (Ti or $TiN_x$)/TiN/$TiN_x$ barrier/wetting layer structure which enables the warm aluminum filling of high aspect ratio vias while providing an aluminum fill exhibiting a high degree of <111> crystal orientation aluminum.

2. Brief Description of the Background Art

Titanium nitride layers have been used in semiconductor device structures as barrier layers for preventing the interdiffusion of adjacent layers of materials such as aluminum and silicon, for example. However, the crystal orientation of aluminum deposited over the surface of the titanium nitride barrier layer is typically polycrystalline, and polycrystalline aluminum has poor electromigration resistance.

In the formation of integrated circuit interconnect structures, such as a Ti/TiN/$TiN_x$ stack, electromigration of aluminum atoms within the aluminum layer becomes a problem if the aluminum layer is not formed with a high degree of <111> crystal orientation. Electromigration of the aluminum atoms can result in open circuits within the integrated circuit structure, and therefore, such electromigration must be inhibited or eliminated. Electromigration of aluminum atoms can occur within filled vias as well, impairing the conductivity of the contacts.

U.S. Pat. No. 4,944,961 to Lu et al., issued Jul. 31, 1990, describes a process for partially ionized beam deposition of metals or metal alloys on substrates, such as semiconductor wafers. Metal vaporized from a crucible is partially ionized at the crucible exit, and the ionized vapor is drawn to the substrate by an imposed bias. Control of substrate temperature is said to allow non-conformal coverage of stepped surfaces such as trenches or vias. When higher temperatures are used, stepped surfaces are planarized. The examples given are for aluminum deposition, where the non-conformal deposition is carried out with substrate temperatures ranging between about 150° C. and about 200° C., and the planarized deposition is carried out with substrate temperatures ranging between about 250° C. and about 350° C.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, January/February 1994. One of the examples given is for titanium nitride film deposition using reactive sputtering, where a titanium cathode is used in combination with a plasma formed from a combination of argon and nitrogen gases.

U.S. Pat. No. 5,262,361 to Cho et al., issued Nov. 16, 1993 describes a method for forming single crystal aluminum films on the surface of a substrate such as silicon (111). The object is to increase the amount of the aluminum (111) crystal orientation, to improve the electromigration resistance of the aluminum. Electrically neutral aluminum is deposited by a vacuum evaporation technique upon a silicon wafer surface at a temperature ranging between about 300° C. and about 400° C.

U.S. Pat. No. 5,543,357 to Yamada et al., issued Aug. 6, 1996, describes a process for manufacturing a semiconductor device wherein a titanium film is used as an under film for an aluminum alloy film to prevent the device characteristics of the aluminum alloy film from deteriorating. The thickness of the titanium film is set to 10% or less of the aluminum alloy film containing no silicon, the titanium film is set to 5% or less of the aluminum alloy film. The aluminum film is formed at a substrate temperature of 200° C. or less by a sputtering process, and when the aluminum film or an aluminum alloy film is to fill a via hole, the substrate is heated to fluidize the aluminum. The pressure during the aluminum film formation and during the fluidization is lower than $10^{-7}$ Torr. A titanium nitride barrier layer may be applied on an interlayered insulating film (or over a titanium layer which has been applied to the insulating film), followed by formation of a titanium film over the titanium nitride film, and finally by formation of the aluminum film over the titanium film. After formation of the titanium nitride barrier layer, the barrier layer is heated to a temperature of about 600° C. to 700° in a nitrogen atmosphere using a halogen lamp so that any titanium which is not nitrided will become nitrated. The titanium nitride barrier layer is said to be a poor barrier layer if un-nitrided titanium is present within the layer.

U.S. Pat. No. 5,571,752 to Chen et al., issued Nov. 5, 1996, discloses a method for patterning a submicron semiconductor layer of an integrated circuit. In one embodiment, titanium or titanium nitride having a thickness of between approximately 300 and 2000 Å is formed by sputter deposition to reach the bottom of a contact opening. The barrier layer may be annealed to form a silicide in the bottom of the opening. A conformal conductive layer of a refractory metal or refractory metal silicide is formed over the titanium or titanium nitride using chemical vapor deposition (CVD). Finally, a second conductive layer, typically aluminum is applied over the surface of the conformal conductive layer. The aluminum is sputtered on, preferably at a temperature ranging between approximately 100° C. and 400° C. This method is said to make possible the filling of contact openings having smaller device geometry design requirements by avoiding the formation of fairly large grain sizes in the aluminum film.

U.S. patent application Ser. No. 08/511,825 of Xu et al., filed Aug. 7, 1995, assigned to the Assignee of the present invention, and hereby incorporated by reference in its entirety, describes a method of forming a titanium nitride-comprising barrier layer which acts as a carrier layer. The carrier layer enables the filling of apertures such as vias, holes or trenches of high aspect ratio and the planarization of a conductive film deposited over the carrier layer at reduced temperatures compared to prior art methods.

U.S. patent application Ser. No. 08/753,251 of Ngan et al., filed Nov. 21, 1996, describes a method for producing a titanium nitride-comprising barrier layer on the surface of a contact via. For certain contact geometries, when the reactor pressure is reduced during formation of the titanium nitride-comprising barrier layer, the thickness of the barrier layer on the sidewalls of the via increases. This enables an aluminum fill to travel along the sidewalls of the via more easily, resulting in a better fill of the via. In particular, the titanium nitride comprising barrier layer needs to be of a minimum thickness and to have a minimum titanium content so that the barrier layer can react slightly with the Aluminum, to draw the aluminum along the sidewalls of the via.

U.S. patent application Ser. No. 08/825,216 of Ngan et al., filed Mar. 27, 1997, discloses various process techniques which can be used to control the crystal orientation of a titanium nitride barrier layer as it is deposited. Further, by increasing the {200} crystal orientation of the titanium nitride barrier layer, the resistivity of this layer is decreased.

A "traditionally sputtered" titanium nitride-comprising film or layer is deposited on a substrate by contacting a titanium target with a plasma created from an inert gas such as argon in combination with nitrogen gas. A portion of the titanium sputtered from the target reacts with nitrogen gas which has been activated by the plasma to produce titanium nitride, and the gas phase mixture contacts the substrate to form a layer on the substrate. Although such a traditionally sputtered titanium nitride-comprising layer can act as a wetting layer for hot aluminum fill of contact vias, good fill of the via generally is not achieved at substrate surface temperature of less than about 500° C.

To provide for aluminum fill at a lower temperature, Xu et al. (as described in U.S. patent application Ser. No. 08/511,825), developed a technique for creating a titanium nitride-comprising barrier layer which can act as a smooth carrier layer, enabling aluminum to flow over the barrier layer surface at lower temperatures (at temperatures as low as about 350° C., for example). A typical barrier layer described by Xu et al., is a combination of three layers including a first layer of titanium (Ti) deposited over the surface of the via; a second layer of titanium nitride (TiN) is deposited over the surface of the first titanium layer; finally a layer of $TiN_x$ is deposited over the TiN second layer. The three layers are deposited using Ion Metal Plasma (IMP) techniques which are described subsequently herein. Typically the first layer of titanium is approximately 100 Å to 200 Å thick; the second layer of TiN is about 800 Å thick, and the third layer of $TiN_x$ is about 60 Å thick. Although a good fill of contact vias having 0.25μ diameter through holes having an aspect ratio of about 5 was achieved, the crystal orientation of the aluminum was low in <111> content, resulting in poor electromigration (EM) performance for the aluminum interconnect. Further, the reflectivity of the aluminum, measured by nanoscope, with Si as a reference, was less than about 50%, so that subsequent lithography indexing was more difficult. It is then desirable to increase the aluminum <111> content for purposes of improving the EM performance and benefiting subsequent lithography process steps.

SUMMARY OF THE INVENTION

It has been discovered that an improved (Ti or $TiN_x$)/TiN/$TiN_x$ barrier layer deposited using IMP techniques can be obtained by increasing the thickness of the first layer of Ti or $TiN_x$ to range from greater than about 100 Å to about 500 Å (the feature geometry controls the upper thickness limit); by decreasing the thickness of the TiN second layer to range from greater than about 100 Å to less than about 800 Å (preferably less than about 600 Å); and, by controlling the application of the $TiN_x$ third layer to provide a Ti content ranging from about 50 atomic percent titanium (stoichiometric) to about 100 atomic percent titanium. When the first layer is $TiN_x$, the atomic percent of Ti is at least 40 atomic percent. Preferably, the first layer is 100 atomic percent Ti. In addition, it is preferred that the $TiN_x$ third layer is formed at the end of the deposition of the TiN second layer and exhibits a Ti content gradient which begins at a stoichiometric Ti content and ends at a Ti content of about 100 atomic percent. The thickness of the $TiN_x$ third layer preferably ranges from about 15 Å to about 500 Å, with the thickness of the 100 atomic percent Ti component ranging from about 15 Å to about 300 Å. The improved (Ti or $TiN_x$)/TiN/$TiN_x$ barrier layer enables the deposit of an aluminum interconnect or an aluminum via fill where the aluminum exhibits a high <111> crystal orientation. Further, the aluminum layer obtained exhibits a reflectivity of 150 percent or greater at 436 nm. A (Ti or $TiN_x$)/TiN/$TiN_x$ barrier layer having this structure, used to line a feature, enables complete filling of the feature with sputtered aluminum, where the size of the feature is about 0.25 micron and the aspect ratio is as high as about 6:1.

The improved (Ti or $TiN_x$)/TiN/$TiN_x$ barrier layer is frequently deposited at a substrate temperature of about 200° C. or lower; and, although the $TiN_x$ third layer may be deposited at a substrate temperature ranging from about 50° C. to about 500° C., it is frequently deposited at about 200° C. or less. When the device structure is an interconnect, the $TiN_x$ third layer can be deposited at pressures ranging from about 5 mT to about 40 mT, preferably at about 25 mT. When the device feature is a via, the $TiN_x$ third layer should be deposited at reduced pressures ranging from about 5 mT to about 10 mT, preferably at about 10 mT. The aluminum fill is then deposited at a substrate temperature ranging from about 350° C. to about 500° C., preferably at about 400° C. The aluminum is deposited at reduced pressures ranging from about 1 mT to about 4 mT, preferably at about 2 mT.

BRIEF DESCRIPTION OF THE DRAWINGS

FIG. 3A shows the X-ray diffraction (XRD) curve for an aluminum film deposited over a Ti/TiN/$TiN_x$ barrier layer of the kind described with reference to U.S. patent application Ser. No. 08/511,825, of Xu et al. This aluminum film exhibits a lower {111} crystal orientation content than desired and exhibits a reflectivity of less than about 50% (measured by nanoscope with Si as a reference).

FIG. 3B shows the XRD curve for an aluminum film deposited over a Ti/TiN/$TiN_x$ barrier layer created using a first preferred embodiment method described herein. This aluminum film exhibits a high <111> content and exhibits a reflectivity of about 195%.

FIG. 3C shows the XRD curve for an aluminum film deposited over a Ti/TiN/$TiN_x$ barrier layer using the preferred embodiment method used to create the barrier layer illustrated in FIG. 3B, except that the substrate temperature during deposition of the barrier layer was substantially higher. This aluminum film exhibits a lower <111> content than desired and exhibits i reflectivity of less than about 50%.

FIG. 3D shows the XRD curve for an aluminum film deposited over a Ti/TiN/$TiN_x$ barrier layer created using a second preferred embodiment method described herein. This aluminum film exhibits a high <111> content and exhibits a reflectivity of about 210%.

DETAILED DESCRIPTION OF THE PREFERRED EMBODIMENTS

Figure 1:
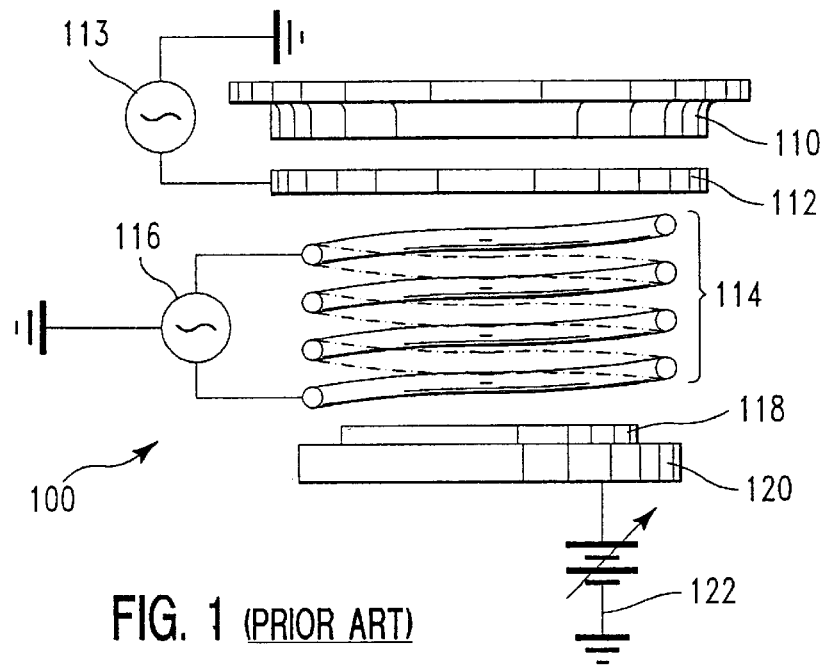
FIG. 1 shows a schematic of the elements of a process chamber which enable physical vapor deposition augmented by an ion metal plasma (IMP).

The present disclosure pertains to a Ti/TiN/TiN$_x$ barrier layer structure and a method of creating that structure. The Ti/TiN/TiN$_x$ barrier layer structure enables the deposition of an overlying aluminum layer having a high <111> crystallographic content and a reflectivity of about 150% or greater. Further, using the barrier layer structure enables the "warm aluminum" filling of vias having an aperture of 0.25 micron or less and having an aspect ratio of about 5:1 and greater.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

Specific terminology of particular importance to the description of the present invention is defined below.

The term "AFM" (Atomic Force Microscope) refers to a technique commonly used to measure film surface roughness, wherein a microprobe in contact with the film surface is drawn across the film and the mechanical movement of the microprobe is translated into a digital signal which is plotted out. A series of plots is compiled and a surface roughness is calculated from the compilation.

The term "aluminum" includes alloys of aluminum of the kind typically used in the semiconductor industry. Such alloys include aluminum-copper alloys, and aluminum-copper-silicon alloys, for example. The preferred embodiments described herein were for aluminum comprising about 0.5% copper.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "feature" refers to contacts, vias, trenches, and other structures which make up the topography of the substrate surface.

The term "ion-deposition sputtered" and the term "ion metal plasma (IMP) refer to sputter deposition, preferably magnetron sputter deposition (where a magnet array is placed behind the target). A high density, inductively coupled RF plasma is positioned between the sputtering cathode and the substrate support electrode, whereby at least a portion of the sputtered emission is in the form of ions at the time it reaches the substrate surface.

The term "reactive ion deposition" or "reactive ion metal plasma (IMP)" refers to ion-deposition sputtering wherein a reactive gas is supplied during the sputtering to react with the ionized material being sputtered, producing an ion-deposition sputtered compound containing the reactive gas element.

The term "reflectivity" refers to reflectivity measured by nanoscope, with Si as a reference.

The term "SEM" refers to a scanning electron microscope.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

The term "warm aluminum" refers to aluminum applied using traditional sputtering techniques, where the substrate temperature during application of the aluminum ranges between about 350° C. to about 450° C.

The term "XPS" refers to X-ray Photoelectron Spectroscopy (also known as ESCA (Electron Spectroscopy for Chemical Analysis), an analytical technique wherein a beam of X-rays is illuminated onto a sample. Photoelectrons, characteristic of the sample elemental composition and corresponding binding energy of each element, are emitted which are detected by an electron energy analyzer. Sensitivity factors are used to transform the measured kinetic energy of photoelectrons into atomic percent composition of different elements in the sample. In addition to detecting atomic percent composition at a sample surface, information for the composition of a sample throughout its thickness can be obtained by depth profiling. In that case, the sample material is sputtered away incrementally using inert ions such as argon ions. At each increment, XPS analysis is performed.

The term "XRD" (X-ray Diffraction) refers to a technique commonly used to measure crystalline orientation, wherein radiation over particular wavelengths is passed through the material to be characterized, and the diffraction of the radiation, caused by the material through which it passes, is measured. A map is created which shows the diffraction pattern, and the crystal orientation is calculated based on this map.

II. An Apparatus for Practicing the Invention

A process system in which the method of the present invention may be carried out is the Applied Materials, Inc.

(Santa Clara, Calif.) Endura® Integrated Processing System. This process system is not specifically shown in the Figures, however, the processing elements shown in FIG. 1 can be operated within one of the low pressure process chambers contained within such an Integrated Processing System. The system is shown and described in U.S. Pat. Nos. 5,186,718 and 5,236,868, the disclosures of which are incorporated by reference. With reference to FIG. 1, one low pressure process chamber for forming the smooth-surfaced, low resistivity, titanium nitride barrier layer of the present invention employs a standard sputter magnet 110 (to confine the sputtering plasma, enabling an increased sputtering rate) and a sputtering target cathode 112 which operates at power levels up to about 24 kW.

EXAMPLE ONE

To form the Ti/TiN/TiN$_x$ barrier layer structure of the present invention a titanium target cathode of about 14 inches (35.5 cm) in diameter was used, and a DC power was applied to this cathode over a range from about 4 kW to about 8 kW. The substrate 118, comprising an 8 inch (20.3 cm) diameter silicon wafer, was placed a distance of about 5.5 inches (14 cm) from target cathode 112. A high density, inductively coupled RF plasma was generated in the region between the target cathode 112 and the substrate 118 by applying RF power 116 over a range from about 100 kHz to about 60 MHz (preferably about 2 MHz), at a wattage ranging from about 0.5 kW to about 6 kW ( preferably ranging from about 1.5 kW to about 4 kW), to a coil 114 having at least one turn up to about 10 turns (preferably from about 1 to 3 turns). Typically the coil is fabricated from metal tubing which permits water cooling, and has a diameter of about 0.125 inch (0.32 cm). However, the coil can be fabricated from a sheet or ribbon, or other form which provides the desired function. Coil 114 surrounded a plasma region between the target 112 and substrate 118. Typically, a substrate bias voltage ranging from 0 to about −300 V DC, preferably about 100 W, is applied to the substrate 118 or the support member 120 to create a D.C. self bias which attracts ions from the plasma to the substrate.

Although the preferred apparatus for forming the titanium nitride barrier layer uses a coil to inductively couple the plasma and ionize the sputtered material, other means for ionizing the titanium are contemplated. For example, an ECR source, such as that shown and described in U.S. Pat. No. 4,911,814, incorporated herein by reference, or a helicon type coupling device such as that shown in U.S. Pat. No. 4,990,229, incorporated herein by reference, are also specifically contemplated. Likewise other apparatus which would supply an ionized stream of deposition particles having an ionized percentage of 10 to 100% are contemplated as being useful to practice the invention. Although the preferred apparatus for forming the titanium atoms which are ionized and reacted with ionized nitrogen to form titanium nitride are preferably formed using sputtering techniques, other means for producing titanium atoms are contemplated. For example titanium evaporation techniques, such as the technique described in U.S. Pat. No. 4,944,961 for vaporizing metal or metal alloy in a crucible, incorporated herein by reference, are also specifically contemplated.

III. The Structure of the (Ti or TiN$_x$)/TiN/TiN$_x$ Barrier Layer

We have been able to create a smooth titanium nitride-comprising barrier layer which has been shown to enable electrical contact fabrication in vias, through holes, and trenches of integrated circuits having a feature size as small as about 0.25 micron, having an aspect ratio of about 5:1 and greater. The smooth barrier layer of the invention, in addition to permitting the formation of a conductive contact at high aspect ratio, provides a diffusion barrier which prevents the inter-diffusion between the electrical contact material such as aluminum and an underlying semiconductor substrate material such as silicon.

The smooth barrier layer structure comprises a stack of three layers. In the more preferred embodiment, the first layer (applied directly over an underlying substrate such as silicon or silicon oxide) is ion-deposited titanium (Ti). The second layer, applied over the first layer, is ion-deposited titanium nitride (TiN). The third layer, applied over the second layer, is an ion-deposited layer, TiN$_x$, where the composition of the layer varies from about 50 atomic % titanium to about 100 atomic % titanium. Preferably the titanium concentration is a gradient beginning with essentially stoichiometric TiN and progressing toward pure Ti. To reduce the potential for reaction of the TiN$_x$ surface with warm aluminum which is subsequently deposited upon it, it is necessary to control the Ti content at the surface of the layer. The optimal Ti content of the TiN$_x$ layer will depend on whether the application is for a horizontal, conductive interconnect or for filling a high aspect ratio via. A high aspect ratio via requires a higher Ti content in the TiN$_x$ layer to provide for the thermodynamic attraction of aluminum fill into the via. However, too high a Ti content results in the production of TiAl$_3$ which negatively impacts device performance. We have discovered that for high aspect ratio via applications, where the TiN$_x$ layer titanium content is a gradient from an atomic concentration of about 50% toward an atomic concentration of 100% Ti, a Ti upper surface thickness of less than about 15 Å is insufficient to draw the warm aluminum into the via in a manner which provides complete fill of the via, while a pure Ti upper surface thickness of more than about 300 Å results in the formation of harmful amounts of TiAl$_3$.

An electrical contact or conductive layer is applied over the smooth barrier layer structure. Although the contact or conductive layer described herein is aluminum containing about 0.5% by weight copper, other conductive materials benefit from use of the smooth barrier layer structure described herein. The <111> crystallographic content of a subsequently applied conductive material and its reflectivity can be adjusted using the concepts described herein. With regard to warm aluminum, the preferred embodiment of this disclosure, the aluminum can be applied using methods other than sputtering, such as evaporation, for example. An ion deposition sputtered application of aluminum provides some advantages in via filling, as it provides a particular conformality on a via sidewall; however, traditionally sputtered aluminum is preferred since this is the least expensive method of application for the aluminum. With regard to traditionally sputtered aluminum, applied as warm aluminum (over a temperature range of from about 350° C. to about 450° C.), preferably the aluminum is applied at reduced pressures ranging from greater than about 0.5 mT up to about 50 mT, preferably between about 1 mT and 30 mT, and more preferably between about 1 mT and 4 mT. The aluminum thickness depends on the application.

Figure 2:
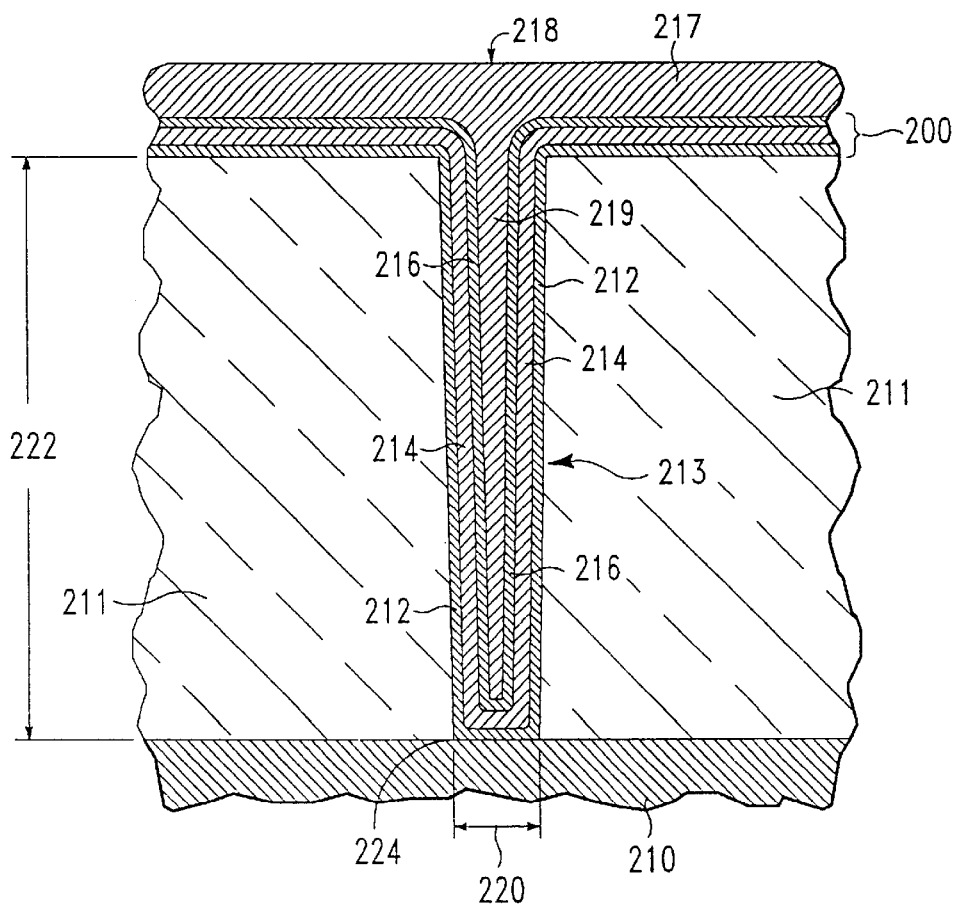
FIG. 2 illustrates a schematic of a conductive contact 218 formed within a high aspect ratio via 213 using the methods and the apparatus described in the present disclosure.

FIG. 2 shows a schematic of a trench or via 213 containing the smooth barrier layer structure 200 of the present invention. The structure 200 was formed on a semiconductor substrate comprising a silicon base 210 having an overlying silicon dioxide layer 211. The via or trench 213 was created by dry etching through the silicon dioxide layer 211 to silicon base 210. Structure 200 comprised three layers: Ti/TiN/TiN$_x$. The first layer of titanium was ion-deposition sputtered upon the surface of both silicon dioxide layer 211 and silicon base 210; a second layer of reactive ion-deposition sputtered titanium nitride layer 214 was deposited overlying first titanium layer 212; and a third ion-deposition sputtered titanium nitride-comprising layer 216 was deposited overlying titanium nitride layer 214. (Upon ion-sputtering of titanium layer 212, a thin layer of titanium silicide 224 is typically formed at the bottom of via 213 upon high temperature annealing). Structure 200 was then filled with a conductive layer 219. The aspect ratio of via or trench 213 was as illustrated by the ratio of dimension 222 to dimension 220, and was approximately 20:1, with the dimension of 220 being approximately 0.25μ.

Aluminum was traditionally sputtered upon a structure 200 at a substrate temperature of about 500° C. In some instances, a cold aluminum nucleation layer was deposited at substrate temperatures of about 50° C. prior to deposition of the remaining aluminum at 500° C. Due to the improved surface on the sidewall of the barrier layer structure 200 which was obtained using IMP, it was possible to eliminate the need to use cold aluminum nucleation layer, so that only one aluminum deposition chamber was necessary. Further, warm aluminum deposition over a temperature ranging from about 350° C. to about 450° C. became feasible. When the specialized barrier layer structure 200 of the present invention is used, a further benefit of high <111> crystallographic orientation aluminum is obtained. Further, particularly high aspect ratio vias can be filled.

EXAMPLE TWO

To obtain an aluminum fill of the via where the crystallographic <111> content was sufficiently high to prevent electromigration, the structure of the Ti/TiN/TiN$_x$ barrier layer 200 was adjusted as follows.

The thickness of the first layer 212 of ion-deposition sputtered Ti was about 300 Å; the thickness of the second layer 214 of reactive ion-deposition sputtered TiN was about 250 Å; and the thickness of the third layer 216 of reactive ion-deposition sputtered TiN$_x$ was about 250 Å. The composition of the TiN$_x$ layer 216 ranged from 50 atomic % Ti initially to toward about 100 atomic % Ti toward the surface of layer 216.

Aluminum was sputtered over the surface of via 213 using traditional sputtering, at a temperature of about 400° C. and at a pressure of about 2 mT.

The <111> crystallographic content of the aluminum fill was about 100% (no 200 was observed on the XRD curve). Further, the reflectivity of the aluminum surface was about 199%.

With reference to FIGS. 3A through 3D, these figures illustrate the XRD curves for warm aluminum applied over the surface of a Ti/TiN/TiN$_x$ barrier layer overlying a flat silicon oxide surface.

FIG. 3A is the XRD curve 310 for warm aluminum applied over the surface of a Ti/TiN/TiN$_x$ barrier layer fabricated using the techniques described above, where the Ti first layer is about 100 Å thick; the TiN second layer is about 800 Å thick, and the TiN$_x$ third layer is about 150 Å thick. The process conditions used during fabrication of the barrier layer included a substrate (wafer) temperature of about 200° C. during the application of each layer; a DC/RF Power Ratio (this power ratio will be described in more detail subsequently) of about 3.3; a Bias to the substrate of about 100 W; and a process chamber pressure of about 30 mT during application of each of the layers.

Warm aluminum sputtering was used to deposit aluminum over the surface of the Ti/TiN/TiN$_x$ barrier layer using traditional sputtering at a substrate temperature of about 400° C. and at a pressure of about 2 mT. The power ratio mentioned above refers to the DC power applied to the sputtering target divided by the RF power to the ionizing device (coil); an example would be 7 kW to the sputtering target and 2 kW to the RF coil, for a power ratio of 3.5.

As indicated by XRD curve 310, with the Intensity of diffraction in arbitrary units indicated on the "y" axis and labeled "312", and 2θ (twice the angle of incidence) indicated in degrees on the "x" axis and labeled "314", the crystal orientation content of the aluminum includes both the desired <111> orientation 316 and undesired {200} orientation 319 (shown enlarged at 318). The weak signal of the <111> orientation which produced a peak height of only about 3,000 is a further indication of the more polycrystalline nature of the warm deposited aluminum. The presence of the undesired {200} orientation aluminum is attributed to the thickness of the TiN layer being 800 Å.

FIG. 3B is the XRD curve 320 for warm aluminum applied over the surface of a Ti/TiN/TiN$_x$ barrier layer fabricated using the techniques described above, where the Ti first layer is about 100 Å thick; the TiN second layer is about 250 Å thick, and the TiN$_x$ third layer is about 150 Å thick. The process conditions used during fabrication of the barrier layer included a substrate (wafer) temperature of about 200° C. during the application of each layer; a DC/RF Power Ratio of about 3.3; a Bias to the substrate of about 100 W; and a process chamber pressure of about 30 mT during deposition of each layer of the barrier layer structure. Aluminum deposited using the warm sputtering process aluminum was sputtered over the surface of the Ti/TiN/TiN$_x$ barrier layer using traditional sputtering at a substrate temperature of about 400° C. and at a pressure of about 2 mT.

As indicated by XRD curve 320, with the Intensity of diffraction indicated on the "y" axis and labeled "322", and 2θ indicated on the "x" axis and labeled "324", the crystal orientation content of the aluminum is limited to the desired <111> orientation, with none of the undesired {200} orientation (which would appear in enlargement 328). The stronger signal of the <111> orientation, which produced a peak height of about 14,000, is a further indication of the higher degree of <111> content in the warm deposited aluminum. The barrier layer structure which enabled the deposition of the aluminum having the XRD curve shown in FIG. 3B is one of the more preferred embodiments of the present invention.

FIG. 3C is the XRD curve 330 for warm aluminum applied over the surface of a Ti/TiN/TiN$_x$ barrier layer fabricated using the techniques described above, where the Ti first layer is about 100 Å thick; the TiN second layer is about 250 Å thick, and the TiN$_x$ third layer is about 150 Å thick. The process conditions used during fabrication of the barrier layer included a substrate (wafer) temperature of about 400° C. during the application of each layer; a DC/RF, Power Ratio of about 3.3; a Bias to the substrate of about 100 W; and a process chamber pressure of about 30 mT during application of the each layer of the barrier layer structure. Warm aluminum was sputtered over the surface of the Ti/TiN/TiN$_x$ barrier layer using traditional sputtering at a substrate temperature of about 400° C. and at a pressure of about 2 mT.

As indicated by XRD curve 330, with the intensity of diffraction indicated on the "y" axis and labeled "332", and 2θ indicated on the "x" axis and labeled "334", the crystal orientation content of the aluminum includes both the desired <111> orientation 336 and undesired {200} orientation 339 (shown enlarged at 338). The extremely weak signal of the {111} orientation, which produced a peak height of only about 34, is an indication that the degree of polycrystalinity of the aluminum is significantly greater than that of the aluminum layer illustrated in FIG. 3. This is further supported by an increased peak height for the {200} crystal orientation fraction of the aluminum. The presence of the undesired {200} orientation aluminum is attributed to the 400° C. deposition temperature used for each of the three barrier layers.

FIG. 3D is the XRD curve 340 for aluminum applied using warm sputtering process aluminum applied over the surface of a Ti/TiN/TiN$_x$ barrier layer fabricated using the techniques described above, where the Ti first layer is about 300 Å thick; the TiN second layer is about 250 Å thick, and the TiN$_x$ third layer is about 150 Å thick. The process conditions used during fabrication of the barrier layer included a substrate (wafer) temperature of about 200° C. during the application of each layer; a DC/RF Power Ratio of about 3.3; a Bias to the substrate of about 100 W; and a process chamber pressure of about 30 mT during application of the Ti and TiN layer, but with the process chamber pressure reduced to about 10 mT during application of the TiN$_x$ layer. Warm aluminum was sputtered over the surface of the Ti/TiN/TiN$_x$ barrier layer using traditional sputtering at a substrate temperature of about 400° C. and at a pressure of about 2 mT.

As indicated by XRD curve 340, with the Intensity of diffraction indicated on the "y" axis and labeled "342", and 2θ indicated on the "x" axis and labeled "344", the crystal orientation content of the aluminum is limited to the desired <111> orientation 346, without the presence of any {200} orientation (which would appear in the enlargement at 348). The very strong signal of the <111> orientation, which produced a peak height of about 27,000, is a further indication of the higher degree of <111> content in the warm deposited aluminum (significantly higher that obtained for the other preferred embodiment of the invention illustrated in FIG. 3B, where the TiN$_x$ layer was deposited at 30 mT). The barrier layer structure which enabled the deposition of the aluminum having the XRD curve shown in FIG. 3D is one of the more preferred embodiments of the present invention.

Figure 4:
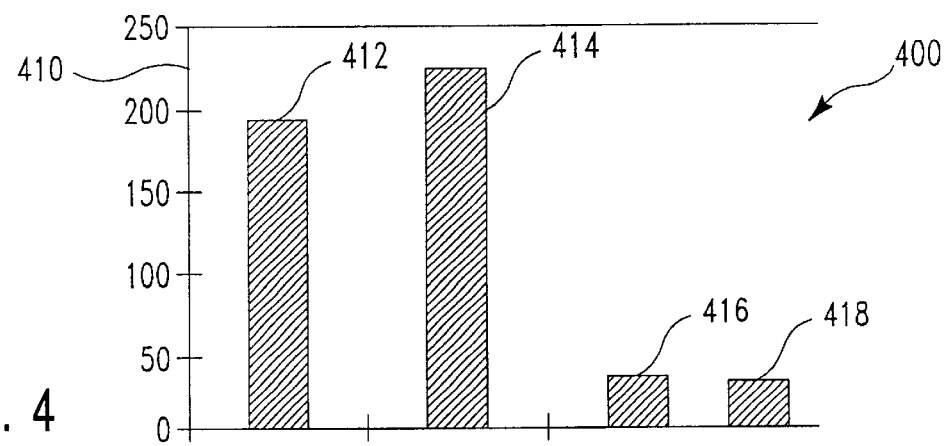
FIG. 4 is a bar graph showing the relative reflectivities for aluminum films deposited over a Ti/TiN/$TiN_x$ barrier layer having the structure and fabricated using the first and second preferred embodiment methods disclosed herein, in comparison with the reflectivities for aluminum films deposited over a Ti/TiN/$TiN_x$ barrier layer having prior art structures and fabricated using prior art methods.

FIG. 4 illustrates the reflectivity for three of the four aluminum/Ti/TiN/TiN$_x$ structures described above and for one different structure. In particular, bar graph 400 shows the percent reflectivity (with Si as a reference) on the "y" axis, labeled "410". Each bar on the "x" axis represents a different aluminum/Ti/TiN/TiN$_x$ structure.

Bar 412 shows the reflectivity of the aluminum layer for the aluminum/Ti/TiN/TiN$_x$ structure illustrated in the XRD curve shown in FIG. 3B. Bar 414 shows the reflectivity an aluminum layer deposited over a Ti/TiN/TiN$_x$ structure where the method used to produce the entire aluminum/Ti/TiN/TiN$_x$ structure was the same as that used to produce the entire FIG. 3B structure, but the thickness of the Ti layer is 300 Å. Bar 416 shows the reflectivity of the aluminum layer for the aluminum/Ti/TiN/TiN$_x$ structure illustrated in the FIG. 3A XRD curve. And, Bar 418 shows the reflectivity of the aluminum layer for the aluminum/Ti/TiN/TiN$_x$ structure illustrated in the FIG. 3C XRD curve.

FIG. 4 illustrates that, in general, a higher aluminum <111> crystal orientation correlates directly with increased aluminum reflectivity.

An even further improvement in reflectivity (and accompanying reduction in surface roughness of the aluminum layer) can be obtained by altering the composition gradient of the third layer TiN$_x$. We have discovered that by increasing the thickness of the pure Ti which deposits at the end of the TiN$_x$ deposition step, an improvement in reflectivity and a smoother-surfaced aluminum can be obtained. In particular, reflectivity was increased from about 210% to about 220% and surface roughness (determined using AFM) was reduced from about 78 Å to about 47 Å.

Figure 5A:
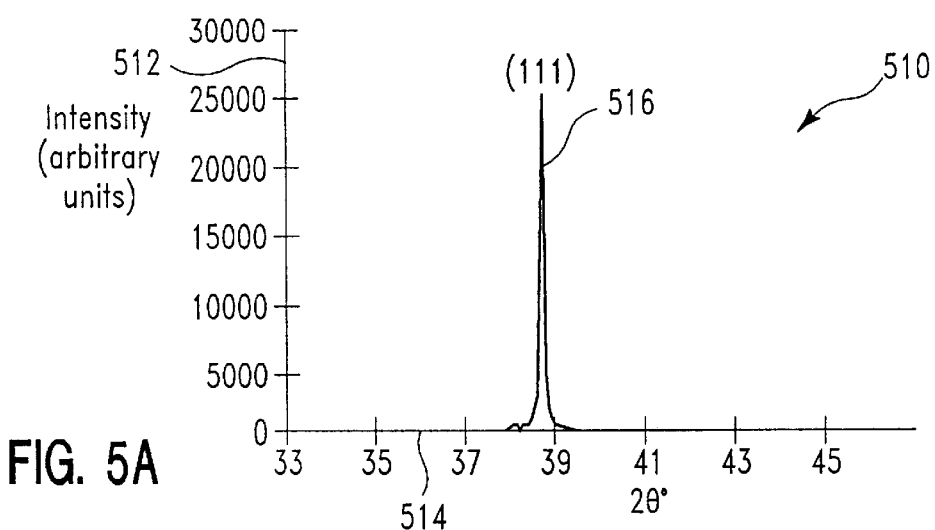
FIG. 5A shows an XRD curve for an aluminum film deposited over a Ti/TiN/TiN$_x$ barrier layer having a structure and fabricated using a third preferred embodiment method disclosed herein. This aluminum film exhibits an AFM roughness (rms) of about 78 Å.
Figure 5B:
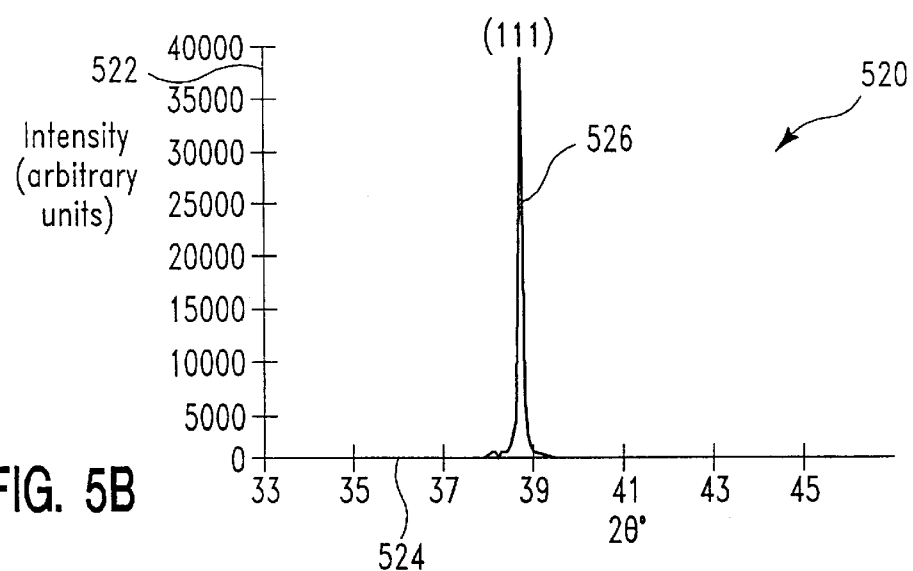
FIG. 5B shows an XRD curve for an aluminum film deposited over a Ti/TiN/TiN$_x$ barrier layer having a structure and fabricated using a fourth preferred embodiment method disclosed herein. This aluminum film exhibits an AFM roughness of about 47 Å.

FIGS. 5A and 5B represent XRD curves for warm aluminum applied over the surface of a Ti/TiN/TiN$_x$ barrier layers fabricated to have a different thickness of Ti at the end of the TiN$_x$, deposition. The barrier layer structures were fabricated using the techniques described above. In particular, the thickness of the first Ti layer was 300 Å, and the thickness of the second TiN layer was 250 Å in each case. All barrier layers were deposited at a substrate temperature of about 200° C. and at a process chamber pressure of 10 mT.

FIG. 5A shows the XRD curve 510 for warm aluminum applied over the surface of the Ti/TiN/TiN$_x$ barrier layer where the TiN$_x$ deposition time was about 15 seconds, and the resulting thickness of the TiN$_x$ layer was about 180 Å. The diffraction Intensity is shown on the "y" axis and labeled "512"; and, 2θ is indicated on the "x" axis and labeled "514". Curve 510 exhibits a strong <111> aluminum crystal orientation peak 516 of about 28,000 in intensity and no detectable presence of {200} crystal orientation. The reflectivity for the aluminum surface is about 210% and the AFM surface roughness is about 78 Å.

FIG. 5B shows the XRD curve 520 for warm aluminum applied over the surface of the Ti/TiN/TiN$_x$ barrier layer where the TiN$_x$ deposition time was about 30 seconds, and the resultant thickness of the TiN$_x$ layer was about 360 Å. The diffraction Intensity is shown on the "y" axis and labeled "522"; and, 2θ is indicated on the "x" axis and labeled "524". Curve 520 exhibits a strong <111> aluminum crystal orientation peak 526 of about 39,000 in intensity and no detectable presence of {200} crystal orientation. The reflectivity for the aluminum surface is about 220% and the AFM surface roughness is about 47 Å.

IV. The Method of Application of Barrier Layers and Aluminum

The apparatus in which the preferred embodiments described herein were fabricated was the Endura® Integrated Processing system previously described, and the elements shown in FIG. 1 were present within one of the low pressure process chambers contained within the Integrated Processing System.

EXAMPLE THREE

The description which follows pertains to the fabrication of a Ti/TiN/TiN$_x$ barrier layer over the surface of a 0.25μ feature size via having an aspect ratio of about 5:1.

With reference to FIG. 2, the via was created by dry etching through the silicon dioxide layer 211 to silicon base 210. Structure 200 comprised three layers: Ti/TiN/TiN$_x$. The first layer of Ti was ion-deposition sputtered (IMP sputtered) upon the surface of both silicon dioxide layer 211 and silicon base 210; a second layer of reactive ion-deposition sputtered (reactive IMP sputtered) TiN layer 214 was deposited overlying first titanium layer 212; and a third ion-deposition sputtered TiN$_x$ layer 216 was deposited overlying titanium nitride layer 214. (Upon ion-sputtering of titanium layer 212, a thin layer of titanium silicide 224 is typically formed at the bottom of via 213 upon high temperature annealing). Structure 200 was then filled with a conductive layer 219.

To obtain an ion-deposition sputtering rate of about 700 Å per minute of Ti upon the surface of an 8 inch (20.3 cm) diameter substrate, 2 MHz (≈2.5 kW) of RF power was applied to coil 114 while 4 kW of DC power was applied to titanium target cathode 112, and a DC bias of about 100 Watts was applied to substrate platen electrode 120. The Ti deposition was carried out at about 30 mT. This pressure corresponded to an argon feed rate of about 65 sccm. The temperature on the substrate surface was about 200° C. To obtain a reactive ion-deposition sputtering rate for TiN of about 250 Å per minute over the Ti first layer surface, 2 MHz (≈2.5 kW) of RF power was applied to coil 214 while 5 kW of DC power was applied to titanium target cathode 212, and a DC bias of about 100 Watts was applied to substrate platen electrode 220. The TiN deposition was carried out at about 30 mT. This pressure corresponded to an argon feed rate of about 10 sccm and a nitrogen feed rate of about 70 sccm in the Applied Materials Endura® Integrated Process System. The temperature on the substrate surface was about 200° C.

To obtain a reactive ion-deposition sputtering rate for $TiN_x$ of about 600 Å per minute upon the TiN second layer surface, the process conditions were set at those specified for the TiN second layer; however, at the beginning of the sputtering of the $TiN_x$ layer, the flow of nitrogen gas to the process chamber was discontinued. Since the titanium target becomes nitrided during the TiN deposition, TiN continues to be produced for a limited time period after the nitrogen gas flow is discontinued. Typically, under the operational conditions specified with reference to the TiN deposition, but with the flow of nitrogen gas to the chamber discontinued, the nitrided portion of the target is sputtered away within 5 to 10 seconds. The thicker the TiN second layer, the longer the time period before the nitrided portion of the target is sputtered away. In this particular instance, the $TiN_x$ layer deposition was carried out for a period of about 15 seconds after the flow of nitrogen to the process chamber was discontinued.

Subsequently an aluminum layer about 6,000 Å thick was sputtered upon the via surface using traditional sputtering techniques, a substrate temperature of about 400° C., and a pressure of about 2 mT. Complete via fill (with essentially no voids evidenced in the photomicrographs) was achieved for the contact vias using the $Ti/TiN/TiN_x$ barrier/wetting layer fabricated as described above.

V. The Composition of Individual Layers in The Barrier Layer Structure

Figure 6A:
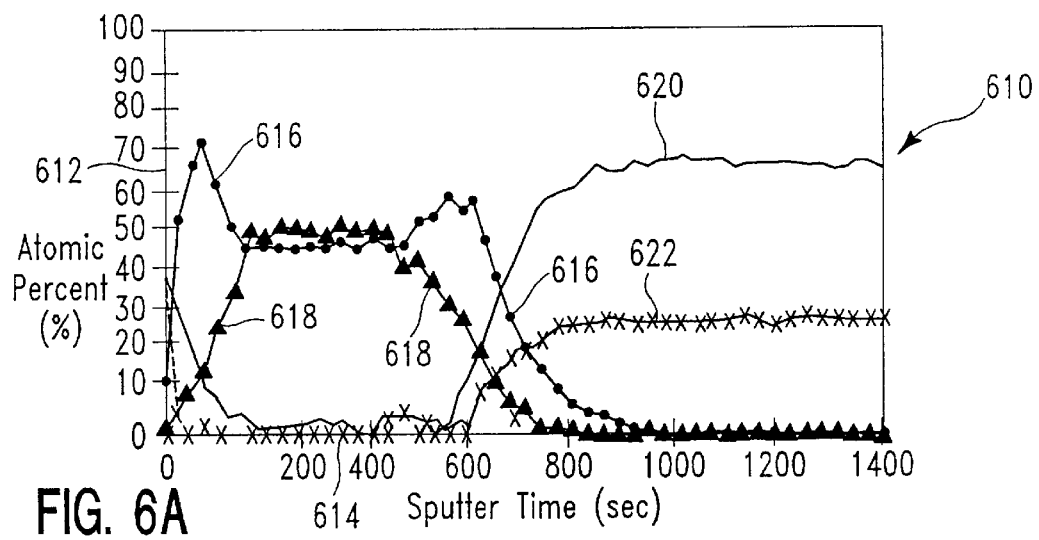
FIG. 6A illustrates an atomic composition profile for a Ti/TiN/TiN$_x$ barrier layer having a cross-sectional thickness profile of 100 Å Ti/250 Å TiN/100 Å TiN$_x$.
Figure 6B:
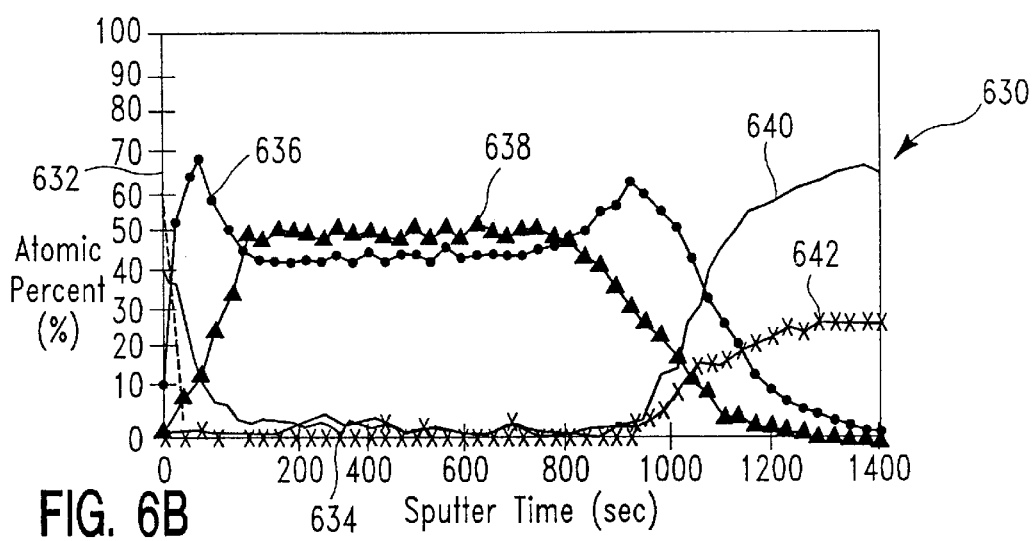
FIG. 6B illustrates an atomic composition profile for a Ti/TiN/TiN$_x$ barrier layer having a cross-sectional thickness profile of 200 Å Ti/500 Å TiN/100 Å TiN$_x$.
Figure 6C:
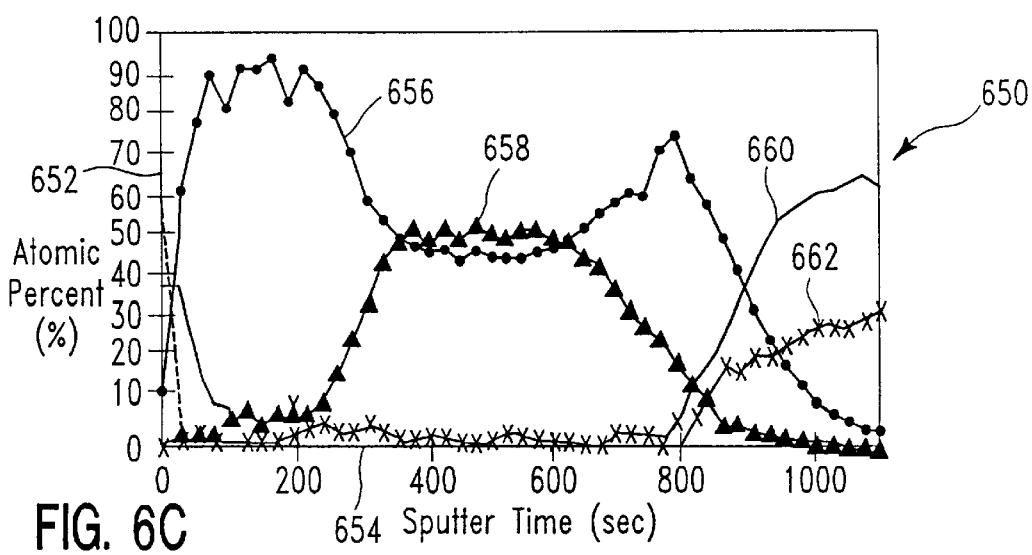
FIG. 6C illustrates an atomic composition profile for a Ti/TiN/TiN$_x$ barrier layer having a cross-sectional thickness profile of 200 Å Ti/250 Å TiN/250 Å TiN$_x$.

FIGS. 6A through 6C show the atomic composition of the three barrier layers as analyzed from the top, through the $TiN_x$ third layer, then the TiN second layer, and then the Ti first layer which lies over a silicon oxide substrate.

Graph 610 shown in FIG. 6A illustrates the composition of the particular barrier layer as the layers are sputtered away during the XPS analytical process. The atomic composition of the material being sputtered using argon ions is represented on the "y" axis, labeled as "612" and is in atomic percent. The time into the analytical process is presented on the "x" axis, labeled "614" and is in seconds. Curve 616 represents the Ti content of the layer being analyzed and curve 618 represents the N content of the layer being analyzed. Curve 620 represents oxygen which is an artifact from cratering of the substrate during the analytical process sputtering. Curve, 622 represents silicon which is also an artifact of the analytical technique.

Graph 610 is representative of a barrier layer having a Ti thickness of about 100 Å; a TiN thickness of about 250 Å, and a $TiN_x$ thickness of about 100 Å, where the $TiN_x$ layer deposition was continued for a period of about 8 seconds after the flow of nitrogen gas flow to the deposition process chamber was shut off.

Graph 630 shown in FIG. 6B illustrates the composition of a second barrier layer structure determined using the analytical technique described with reference to FIG. 6A. The atomic composition of the layer being analyzed is represented on the "y" axis, labeled as "632" and is in atomic percent. The time into the analytical process is presented on the "x" axis, labeled as "634" and is in seconds. Curve 636 represents the Ti content of the layer being analyzed, and Curve 638 represents the N content of the layer being analyzed. Curve 640 represents oxygen artifact and Curve 642 represents the silicon artifact.

Graph 630 is representative of a barrier layer having a Ti thickness of about 200 Å; a TiN thickness of about 500 Å, and a $TiN_x$ thickness of about 100 Å, where the $TiN_x$ layer deposition was again continued for a period of about 8 seconds after the flow of nitrogen gas to the deposition process chamber was shut off.

Graph 650 shown in FIG. 6C illustrates the composition of a third barrier layer structure determined using the analytical technique described with reference to FIG. 6A. The atomic composition of the layer being analyzed is represented on the "y" axis, labeled as "652" and is in atomic percent. The time into the analytical process is presented on the "x" axis, labeled as "654" and is in seconds. Curve 656 represents the Ti content of the layer being analyzed, and Curve 658 represents the N content of the layer being analyzed. Curve 660 represents oxygen artifact and Curve 662 represents the silicon artifact.

Graph 650 is representative of a barrier layer having a Ti thickness of about 200 Å; a TiN thickness of about 250 Å, and a $TiN_x$ thickness of about 250 Å, where the $TiN_x$ layer deposition was continued for a period of about 20 seconds after the flow of nitrogen gas to the deposition process chamber was shut off.

These structures are obtainable in a single process chamber, using a single Ti sputtering target, and can be fabricated in a continuous process. The simplicity of producing such barrier layer structures, combined with the excellent functionality of the barrier layers makes them especially attractive for semiconductor device fabrication. In particular, using the barrier layer structures and the fabrication methods disclosed herein enables the formation of aluminum-comprising layers having high aluminum <111> crystal orientation which reduces electromigration problems. Further, using the barrier layer structures and the fabrication methods disclosed herein enables the formation of high reflectivity aluminum-comprising layers which are useful in lithographic indexing.

The above described preferred embodiments are not intended to limit the scope of the present invention, as one skilled in the art can, in view of the present disclosure expand such embodiments to correspond with the subject matter of the invention claimed below.

We claim:

1. A method of producing an aluminum-comprising layer having a crystal orientation which is essentially <111>, by depositing said aluminum-comprising layer over the surface of a (Ti or $TiN_x$)/TiN/$TiN_x$ underlying structure which induces <111> crystal orientation in said aluminum-comprising layer, wherein said (Ti or $TiN_x$)/TiN/$TiN_x$ underlying structure is formed without an annealing step and by:

a) using ion deposition sputtering to apply a first layer of Ti or TiN$_x$ having a thickness ranging from about 100 Å to about 500 Å;

b) using reactive ion deposition sputtering to apply a second layer of TiN having a thickness ranging from about 100 Å to less than about 800 Å; and c) using reactive ion deposition sputtering to apply a third layer of TiN$_x$ having a thickness ranging from about 15 Å to about 500 Å, wherein said first and second layers are deposited at a temperature of about 200° C. or less and said third layer is deposited at a substrate temperature ranging from about 50° C. to about 500° C.

2. The method of claim 1, wherein said reactive ion deposition sputtering of said third layer which is TiN$_x$ is carried out by sputtering Ti in the presence of nitrogen, and wherein said nitrogen presence is controlled to produce a TiN$_x$ layer having 100 atomic percent of Ti component at the upper surface of said TiN$_x$ layer.

3. The method of claim 2, wherein the thickness of said 100 atomic percent Ti component ranges from about 15 Å to less than about 300 Å.

4. The method of claim 1, wherein said (Ti or TiN$_x$)/TiN/TiN$_x$ underlying structure is deposited at a substrate temperature of about 200° C. or less.

5. The method of claim 1, wherein said third layer which is TiN$_x$ is applied at process chamber pressures ranging from about 0.5 mTorr to about 30 mTorr.

6. The method of claim 5, wherein said pressure is about 10 mTorr or less.

7. The method of claim 1, wherein said aluminum-comprising layer is deposited at a temperature ranging from about 350° C. to about 500° C.

8. A method of producing an aluminum-comprising layer having a crystal orientation which is essentially <111>, by depositing said aluminum-comprising layer over the surface of a (Ti or TiN$_x$)/TiN/TiN$_x$ underlying structure which induces <111> crystal orientation in said aluminum-comprising layer, wherein said (Ti or TiN$_x$)/TiN/TiN$_x$ underlying structure is formed without an annealing step and by:

a) using ion deposition sputtering to apply a first layer of Ti or TiN$_x$ having a thickness ranging from about 100 Å to about 500 Å;

b) using reactive ion deposition sputtering to apply a second layer of TiN having a thickness ranging from about 100 Å to less than about 800 Å; and c) using reactive ion deposition sputtering to apply a third layer of TiN$_x$ having a thickness ranging from about 15 Å to about 500 Å, wherein said third layer of TiN$_x$ is produced in a manner which provides a decreasing nitrogen content as deposition continues, so that the upper surface of said third layer is pure titanium, and wherein said third layer is deposited at a substrate temperature ranging from about 50° C. to about 500° C.

* * * * *